(12) United States Patent
Hur et al.

(10) Patent No.: US 8,054,702 B2
(45) Date of Patent: Nov. 8, 2011

(54) SEMICONDUCTOR MEMORY DEVICE WITH SIGNAL ALIGNING CIRCUIT

(75) Inventors: Hwang Hur, Kyoungki-do (KR); Chang-Ho Do, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 161 days.

(21) Appl. No.: 12/472,252

(22) Filed: May 26, 2009

(65) Prior Publication Data

US 2009/0231933 A1 Sep. 17, 2009

Related U.S. Application Data

(62) Division of application No. 11/478,092, filed on Jun. 30, 2006, now Pat. No. 7,804,723.

(30) Foreign Application Priority Data

Sep. 28, 2005 (KR) .................. 10-2005-0090855
Apr. 13, 2006 (KR) .................. 10-2006-0033765

(51) Int. Cl.
    *G11C 7/00* (2006.01)
(52) U.S. Cl. .............. 365/198; 365/191; 365/230.08
(58) Field of Classification Search ............ 365/189.03, 365/189.17, 191, 201, 219, 198, 230.08
    See application file for complete search history.

(56) References Cited

U.S. PATENT DOCUMENTS

| | | | |
|---|---|---|---|
| 5,648,776 A | 7/1997 | Widmer | |
| 5,751,724 A * | 5/1998 | Elliott | 370/536 |
| 5,778,214 A | 7/1998 | Taya et al. | |
| 5,848,022 A | 12/1998 | Jiang | |
| 5,862,143 A | 1/1999 | Suh | |
| 5,940,345 A | 8/1999 | Davidson | |
| 6,052,073 A | 4/2000 | Carr et al. | |
| 6,175,886 B1 | 1/2001 | Usami | |
| 6,625,240 B1 * | 9/2003 | Miyahara | 375/366 |
| 6,950,370 B2 * | 9/2005 | Lee | 365/233.13 |
| 7,551,645 B2 * | 6/2009 | Gulati et al. | 370/474 |
| 2003/0061527 A1 | 3/2003 | Haycock et al. | |

* cited by examiner

*Primary Examiner* — Alexander Sofocleous
(74) *Attorney, Agent, or Firm* — IP & T Group LLP

(57) ABSTRACT

A signal aligning circuit includes a plurality of pads receiving input signals in parallel 1 bit by 1 bit; a first transferring unit for transferring the input signals as first signals in synchronization with a first clock signal of an internal clock, and transferring the input signals as second signals in synchronization with a second clock signal of the internal clock; a second transferring unit for transferring the first signals in synchronization with the second clock signal of the internal clock; and an aligning unit for aligning the first and second signals transferred from the first and second transferring units and outputting the aligned signal as output signals.

46 Claims, 9 Drawing Sheets

SEMICONDUCTOR MEMORY DEVICE WITH SIGNAL ALIGNING CIRCUIT

This application is a division of U.S. patent application Ser. No. 11/478,092 filed on Jun. 30, 2006 now U.S. Pat. No. 7,804,723, which claims priority of Korean patent application number 10-2005-0090855 filed on Sep. 28, 2005 and Korean patent application number 10-2006-0033765 filed on Apr. 13, 2006. The disclosure of each of the foregoing applications is incorporated herein by reference in its entirety.

FIELD OF THE INVENTION

The present invention relates to a semiconductor memory device, and more particularly to a signal aligning circuit for aligning input signals when the number of input pads or pins is smaller than the number of external input signals.

DESCRIPTION OF RELATED ARTS

Generally, most memory devices including random access memory (RAM) have a single port with a plurality of input/output pin sets. That is, a single port is provided for data exchange between a memory device and an external chipset. Such a memory device having a single port uses a parallel input/output interface to simultaneously transmit multi-bit data through a signal line connected to a plurality of input/output (I/O) pins. The memory device exchanges data with the external device through a plurality of I/O pins in parallel.

The I/O interface is an electrical and mechanical scheme to connect unit devices having different functions through signal lines and transmit transmission/reception data precisely. An I/O interface, described below, must have the same precision. The signal line is a bus for transmitting an address signal, a data signal, and a control signal. A signal line, described below, will be referred to as a bus.

A parallel I/O interface has high data processing efficiency (speed) because it can simultaneously transmit multi-bit data through a plurality of buses. Therefore, the parallel I/O interface is widely used in a short distance transmission that requires a high speed. In the parallel I/O interface, however, the number of buses for transmitting I/O data increases. Consequently, as distance increases, the manufacturing cost increases. Due to the limitation of a single port, a plurality of memory devices are independently configured so as to support various multi-media functions in terms of hardware of a multi-media system. While an operation for a certain function is carried out, an operation for another function cannot be concurrently carried out.

Considering the disadvantage of the parallel I/O interface, many attempts to change the parallel I/O interface into serial I/O interface have been made. Also, considering compatible expansion with devices having other serial I/O interfaces, the change to serial I/O interface in I/O environment of the semiconductor memory device is required. Moreover, appliance devices for audio and video are embedded into display devices, such as high definition television (HDTV) and liquid crystal display (LCD) TV. Because these appliance devices require independent data processing, there is a demand for multi-port memory devices having a serial I/O interface using a plurality of ports.

A conventional multi-port memory device having a serial I/O interface includes a processor for processing serial I/O signals, and a DRAM core for performing a parallel low-speed operation. The processor and the DRAM core are implemented on the same wafer, that is, a single chip.

FIG. 1 is a block diagram of a conventional multi-port memory device having a serial I/O interface. For convenience of explanation, the multi-port memory device having four ports PORT0-PORT3 and eight banks BANK0-BANK7 is illustrated. Each of the banks has a 16K (row)×4K (column) memory cell array.

The multi-port memory device having the serial I/O interface includes serial I/O pads TX+, TX−, RX+ and RX−, ports PORT0 to PORT3, banks BANK0 to BANK7, and global data buses.

Such a multi-port memory device has to be configured such that signals (hereinafter, referred to as "input valid data signals") input through the ports PORT0 to PORT3 can all be input to all banks BANK0 to BANK7, and signals (hereinafter, referred to as "output valid data signals") output from the banks BANK0 to BANK7 can be selectively transferred to all ports PORT0 to PORT3.

For this purpose, the ports PORT0 to PORT3 and the banks BANK0 to BANK7 are connected together through the global data buses. The global data buses include input buses GIO_IN for transferring the input valid data signals from the ports PORT0 to PORT3 to the banks BANK0 to BANK7, and output buses GIO_OUT for transferring the output valid data signals to the ports PORT0 to PORT3.

The global data buses are divided into the input buses GIO_IN and the output buses GIO_OUT. The input buses GIO_IN transfer the parallel input valid data signals from the ports PORT0 to PORT3 to the banks BANK0 to BANK7. The output buses GIO_OUT transfer the parallel input valid data signals from the banks BANK0 to BANK7 to the ports PORT0 to PORT3.

The input valid data signals from the ports PORT0 to PORT3 contain information in a bank selection signal for selecting the banks BANK0 to BANK7. Therefore, signals indicating which ports the signals access and which banks access through the ports are input to the banks BANK0 to BANK7. Accordingly, the port information is selectively transferred to the banks and the bank information is transferred to the global data buses designated to the ports.

The ports PORT0 to PORT3 include a serializer & deserializer (SERDES) that converts the signals input through the reception pads RX+ and RX− into the parallel input valid data signals as a low speed data communication scheme, and transfers them through the input buses GIO_IN to the DRAM core of the banks BANK0 to BANK7, and also converts the parallel output valid data signals, which are output from the DRAM core of the banks BANK0 to BANK7 through the output buses GIO_OUT, into the serial signals as a high speed data communication scheme, and outputs them through the transmission pads TX+ and TX−.

FIG. 2 is a block diagram of the ports PORT0 to PORT3 illustrated in FIG. 1.

The ports PORT0 to PORT3 perform data communication with an external device in a serial I/O interface through the serial I/O pads TX+, TX−, RX+ and RX−. The signals input through the reception pads RX+ and RX− are serial high-speed input signals, and the signals output through the transmission pads TX+ and TX− are serial high-speed output signals. Generally, the high-speed I/O signals include differential signals for recognizing the high-speed I/O signals smoothly. The differential I/O signals are distinguished by indicating the serial I/O pads TX+, TX−, RX+ and RX− with "+" and "−".

The ports PORT0 to PORT3 include a serializer & deserializer (SERDES) 20 and a logic unit 30. The SERDES 20 includes a driver 21, a serializer 22, an input latch 23, a clock generator 24, an input buffer 25, a deserializer 26, and a data output unit 27.

The driver 21 outputs the output valid data signals serialized by the serializer 22 to an external device through the transmission pads TX+ and TX− in a differential type.

The serializer 22 serializes the parallel output valid data signals input from the input latch 23 in synchronization with an internal clock generated from the clock generator 24, and outputs the serial output valid data signals to the driver 21.

The input latch 23 latches the output valid data signals output through the output buses GIO_OUT in synchronization with the internal clock and transfers the latched signals to the serializer 22.

The input buffer 25 buffers an external signal input from the external device through the reception pads RX+ and RX− in synchronization with the internal clock and transfers the buffered signal to the deserializer 26.

The deserializer 26 deserializes the external signal input from the input buffer 25 in synchronization with the internal clock and outputs the parallel input valid data signals to the data output unit 27.

The data output unit 27 transfers the input valid data signals from the deserializer 26 through the input buses GIO_IN.

The clock generator 24 receives a reference clock RCLK from external device to generate the internal clock. The internal clock has period and phase equal to those of the reference clock RCLK, or period and/or phase different from those of the reference clock RCLK. Also, the clock generator 24 can generate one internal clock using the reference clock RCLK or can generate at least two internal clocks having different periods and phase.

An operation characteristic of the ports PORT0 to PORT3 will be described below in detail.

First, the process of transferring the external signal via the input buses GIO_IN will be described. The external signal is input from the external device through the reception pads RX+ and RX− in a frame form at high speed.

The external signal is sampled through the input buffer 25 synchronized with the internal clock output from the clock generator 24. The input buffer 25 transfers the buffered external signal to the deserializer 26. The deserializer 26 deserializes the external signal input from the input buffer 25 in synchronization with the internal clock, and outputs the parallel input valid data signal to the data output unit 27. The data output unit 27 transfers the parallel input valid data signal from the deserializer 26 through the input bus GIO_IN.

Next, the process of converting the parallel output valid data signals output through the output bus GIO_OUT into the serial signals and transferring them to the external device through the transmission pads TX+ and TX− will be described below.

The parallel output valid data signals are transferred to the input latch 23 through the output buses GIO_OUT. The input latch 23 latches the output valid data signals output through the output buses GIO_OUT in synchronization with the internal clock and transfers the latched signals to the serializer 22. Like the input latch 23, the serializer 22 serializes the output valid data signals transferred from the input latch 23 in synchronization with the internal clock and transfers the serial signals to the driver 21. The driver 21 receives the serial signals from the serializer 22 and outputs them to the external device through the transmission pads TX+ and TX−.

The logic unit 30 receives the parallel signals input through the reception pads RX+ and RX− and deserialized by the SERDES 20 and decodes the parallel signals according to a predetermined specification to generate row/column addresses and commands. DRAM cells are accessed according to the addresses and commands from the LOGIC UNIT 30, and data read/write operations are then carried out.

Since the above-described multi-port memory device is configured to perform the data communication with the external device in the high-speed serial I/O interface, it must transmit data at a higher speed compared with the existing typical DRAMs. Accordingly, a conventional test device for testing the typical DRAM device is limited in transferring and recognizing high-speed data signals.

Generally, the DRAM has a predetermined number of address pins, which is determined by a larger one of the number of row addresses and the number of column addresses. Also, the DRAM has a plurality of command pins and a plurality of test data I/O pins (hereinafter, referred to as DQ pins). In testing a DRAM core, commands are input from the test device supporting the parallel I/O interface through the command pins, and cell addresses to be accessed are simultaneously input through the address pins. Then, the DRAM core is tested by analyzing the data output through the DQ pins.

For this reason, when the DRAM core of the multi-port memory device is tested using the test device supporting the conventional parallel I/O interface, the I/O pads TX+, TX−, RX+ and RX− supporting the high-speed serial data communication have to be switched into the parallel I/O pads. The I/O pads TX+, TX−, RX+ and RX− are physically divided into the transmission pads TX+ and TX− and the reception pads RX+ and RX− by the ports PORT0 to PORT3. That is, the transmission function and the reception function are separated from each other because the output driver and the input buffer are separately connected to the transmission pads and the reception pads. Therefore, the use of the transmission pads TX+ and TX− as the input pads means a change of the internal structure of the ports PORT0 to PORT3. Therefore, the circuit configuration becomes complicated. A method of using the reception pads RX+ and RX− as the input pads during test can be proposed.

However, this method is not matched with the increase in the size of the banks. Specifically, since the multi-port memory device of FIG. 1 includes banks BANK0 to BANK7 each having 16K (row)×4K (column) memory cell arrays, 14 (14-bit) row addresses and 6 (6-bit) column addresses are required to access a specific cell. Also, 3 (3-bit) bank addresses are further required to access eight banks BANK0 to BANK7. Consequently, at least 17-bit signals have to be input from the test device. However, since two reception pads RX+ and RX− are provided at each port PORT0 to PORT3, the total number of reception pads is only eight (8 bits). Therefore, in order to use the existing DRAM test method in the DRAM device of FIG. 1, pads (pins) that can apply commands and addresses have to be further provided.

In this case, since the number of kinds of command signals is small, the above-described problem can be solved by adding additional pads. However, since the number of the pads for receiving the address signals is large, a large number of pads are required. Therefore, a gap between adjacent pads becomes narrow. Also, additional circuits such as Electrostatic Discharge (ESD) for preventing electrostatic electricity caused by interference between pads have to be added, thus degrading area efficiency.

SUMMARY OF THE INVENTION

It is, therefore, an object of the present invention to provide a signal aligning circuit that can be stably tested without adding I/O pads even when the number of data I/O pads is smaller than the number of addresses for accessing the memory cell.

It is another object of the present invention to provide a semiconductor memory device that can be stably tested without adding I/O pads even when the number of data I/O pads is smaller than the number of addresses for accessing the memory cell.

It is a further object of the preset invention to provide a semiconductor memory device that can perform a test stably without adding I/O pads in testing the DRAM core of the multi-port memory device, which performs the data communication with an external device in serial I/O interface, by using a test device supporting the parallel I/O interface, even when the number of data I/O pads is smaller than the number of addresses for accessing the memory cell.

In accordance with an aspect of the present invention, there is provided a signal aligning circuit including: a plurality of pads receiving input signals in parallel 1 bit by 1 bit; a first transferring unit for transferring the input signals as first signals in synchronization with a first clock of an internal clock, and transferring the input signals as second signals in synchronization with a second clock of the internal clock; a second transferring unit for transferring the first signals in synchronization with the second clock of the internal clock; and an aligning unit for aligning the first and second signals transferred from the first and second transferring units and outputting the aligned signal as output signals.

In accordance with another aspect of the present invention, there is provided a semiconductor memory device having a memory cell array and performing a test operation by using first signals input through a plurality of pads in parallel 1 bit by 1 bit in a test mode, the semiconductor memory device including: a signal aligning circuit for sequentially storing and aligning bits of the first signals, the number of which corresponds to the number of pads, generating second signals, the number of which is n times the number of the pads (where n is integers equal to or greater than 2), and outputting the second signals to the memory cell array.

In accordance with further another aspect of the present invention, there is provided a semiconductor memory device having a plurality of transmission/reception pads, a plurality of ports performing a serial data communication with an external device through the transmission/reception pads, a plurality of banks performing a parallel data communication with the ports, and a plurality of global data buses providing a data communication between the banks and the ports, the semiconductor memory device including: a signal aligning circuit for sequentially storing and aligning bits of the first signals from the reception pads in parallel 1 bit by 1 bit in a test mode of the bank, the bit number of the first signals corresponding to the number of pads, generating second signals the bit number of which is n times the number of the reception pads (where n is integers equal to or greater than 2), and outputting the second signals to the banks through the global data buses.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a signal aligning circuit and a semiconductor device with the same in accordance with exemplary embodiments of the present invention will be described in detail with reference to the accompanying drawings.

Figure 1:
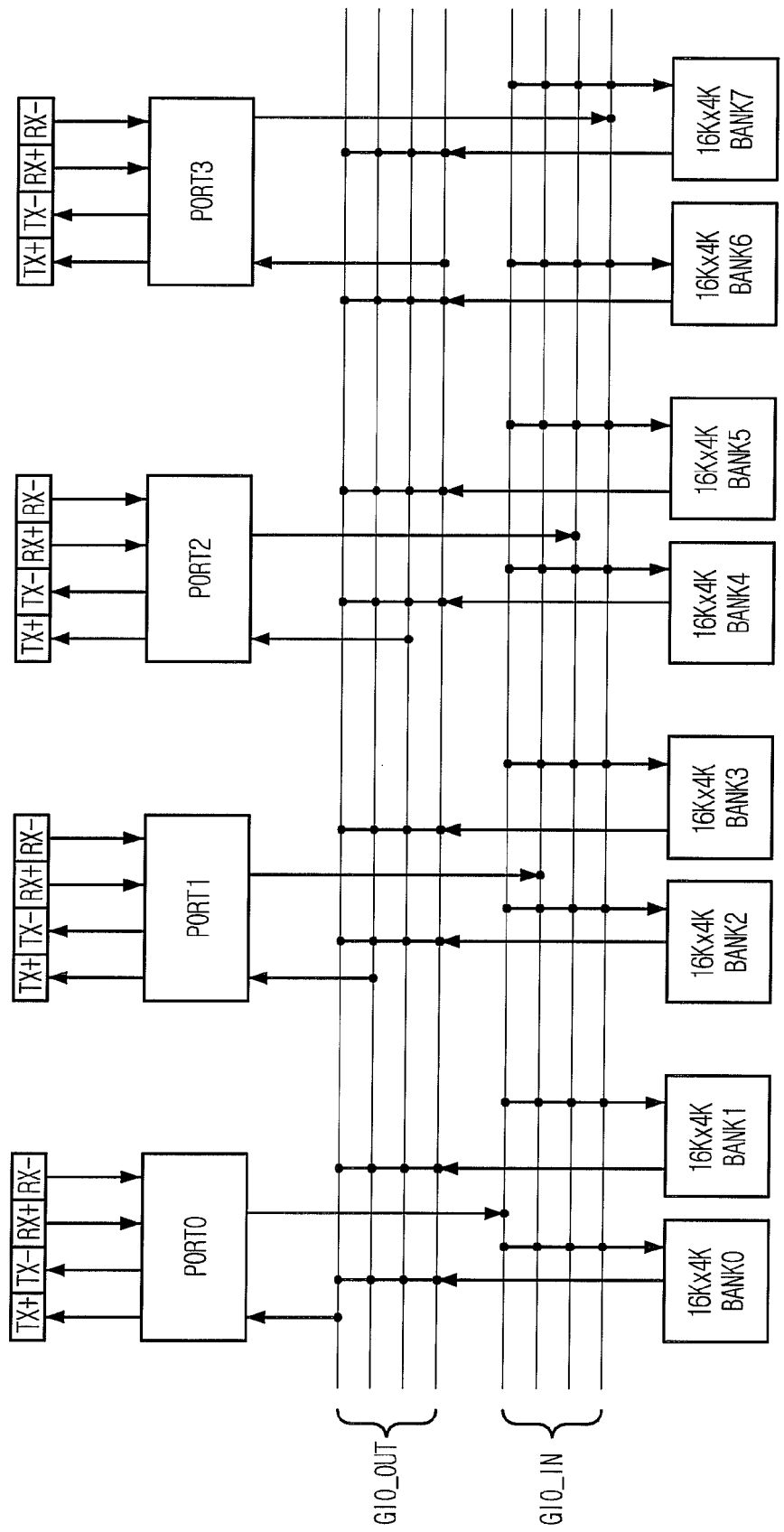
FIG. 1 is a block diagram of a conventional multi-port memory device.
Figure 2:
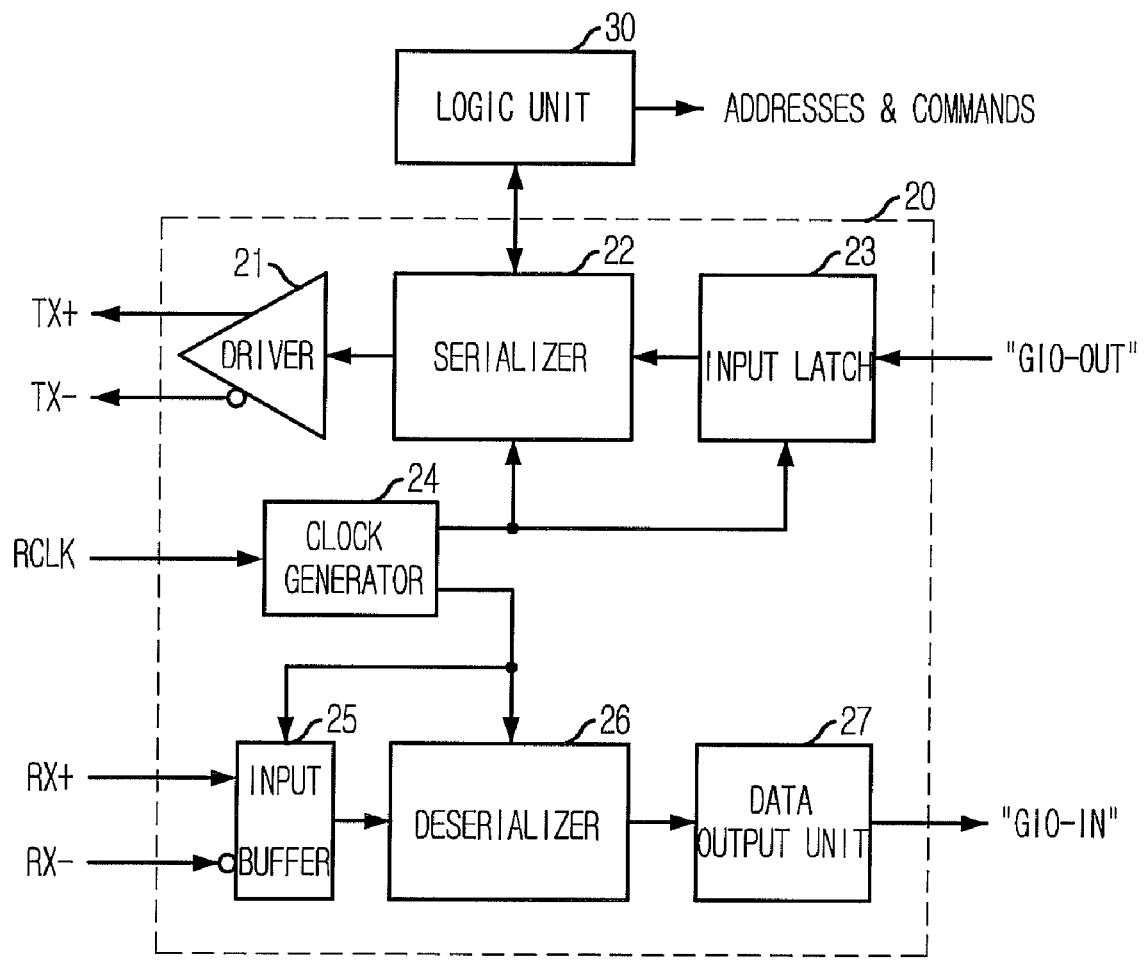
FIG. 2 is a block diagram of a PORT illustrated in FIG. 1.
Figure 3:
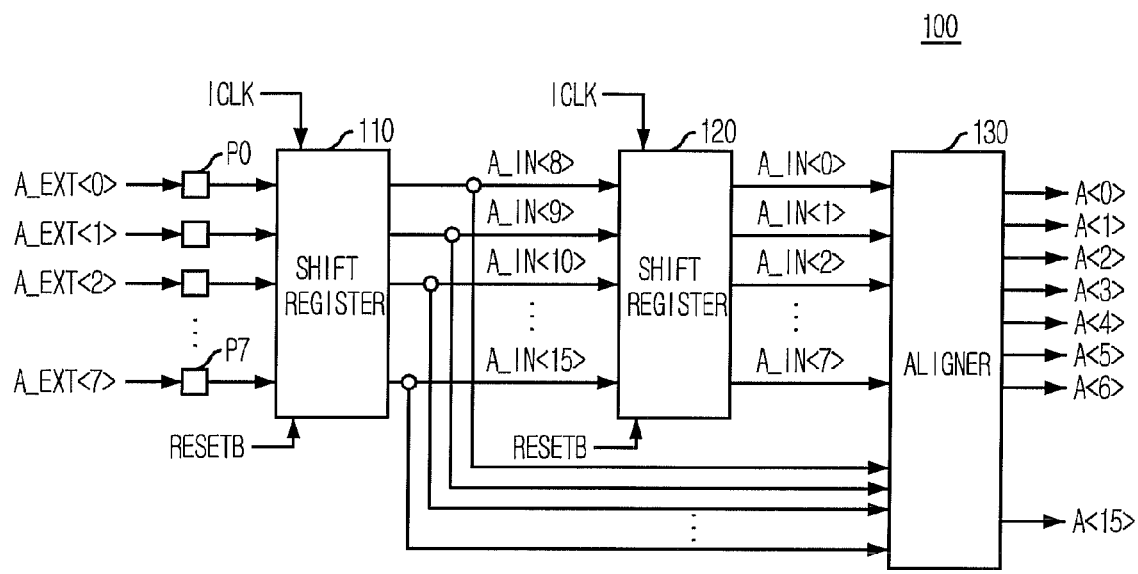
FIG. 3 is a block diagram of a signal aligning circuit in accordance with a first embodiment of the present invention.

FIG. 3 is a block diagram of a signal aligning circuit 100 in accordance with a first embodiment of the present invention. Specifically, FIG. 3 illustrates an address aligning circuit 100 that receives 8 bits through eight reception pads at a time.

The signal aligning circuit 100 includes a first shift register 110, a second shift register 120, and an aligner 130.

The first and second shift registers 110 and 120 receive external address signals A_EXT<0:7> input from a plurality of pads P0 to P7 in parallel 1 bit by 1 bit, and sequentially store bits, the number of which corresponds to that of the pads P0 to P7. The aligner 130 aligns internal address signals A_IN<0:7> and A_IN<8:15> transferred from the first and second shift registers 110 and 120, and generates address signals A<0:15> whose bit number is two times that of the pads P0 to P7.

Figure 4:
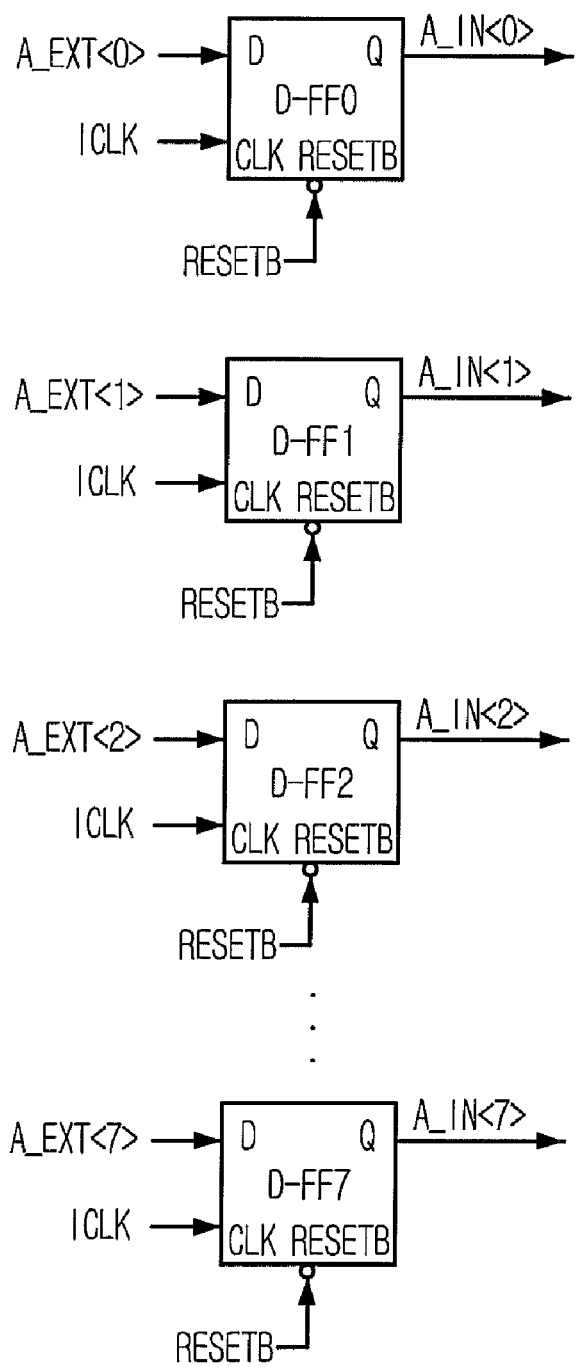
FIG. 4 is a circuit diagram of a first shift register illustrated in FIG. 3.

FIG. 4 is a circuit diagram of the first shift register 110 illustrated in FIG. 3.

The first shift register 110 receives the external address signals A_EXT<0:7> input through the pads P0 to P7 in parallel 1 bit by 1 bit, and transfers them to the second shift register 120 in synchronization with rising edges of a first clock CLK0 of the internal clock ICLK. Then, the first shift register 110 receives next 8-bit external address signals A_EXT<0:7>, and transfers them to the aligner 130 in synchronization with rising edges of a second clock CLK1 of the internal clock CLK.

For this operation, as illustrated in FIG. 4, the first shift register 110 includes eight D flip-flops D-FF0 to D-FF7 corresponding to the number of the external address signals A_EXT<0:7>. Each of the D flip-flops D-FF0 to D-FF7 receives a corresponding one of the external address signals 1 bit by 1 bit and outputs them to the second shift register 120 and the aligner 130 at every rising edge of the internal clock ICLK. Each of the D flip-flops D-FF0 to D-FF7 is reset in response to an initialization signal RESETB.

Figure 5:
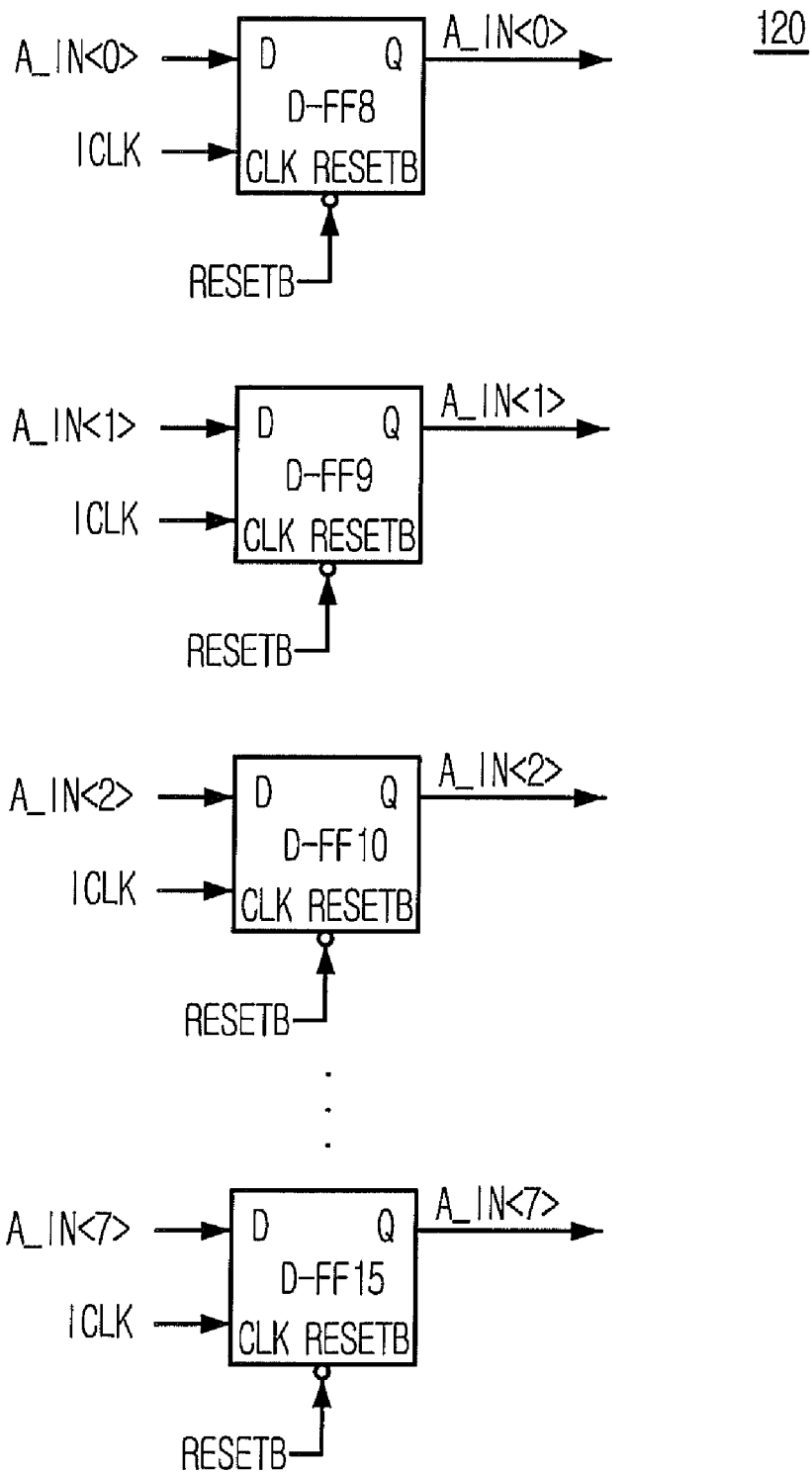
FIG. 5 is a circuit diagram of a second shift register illustrated in FIG. 3.

FIG. 5 is a circuit diagram of the second shift register 120 illustrated in FIG. 3.

The second shift register 120 receives internal address signals A_IN<0:7> transferred 1 bit by 1 bit from the D flip-flops D-FF0 to D-FF7 of the first shift register 110, and outputs them to the aligner 130 in synchronization with the rising edges of the second clock CLK1 of the internal clock ICLK.

For this operation, as illustrated in FIG. 5, the second shift register 120 includes eight D flip-flops D-FF8 to D-FF15. Each of the D flip-flops D-FF8 to D-FF15 receives the internal address signals A_IN<0:7> from the first shift register 110 1 bit by 1 bit and outputs them to the aligner 130 in synchronization with the rising edge of the second clock CLK1 of the internal clock ICLK. Each of the D flip-flops D-FF8 to D-FF15 is reset in response to an initialization signal RESETB.

Figure 6:
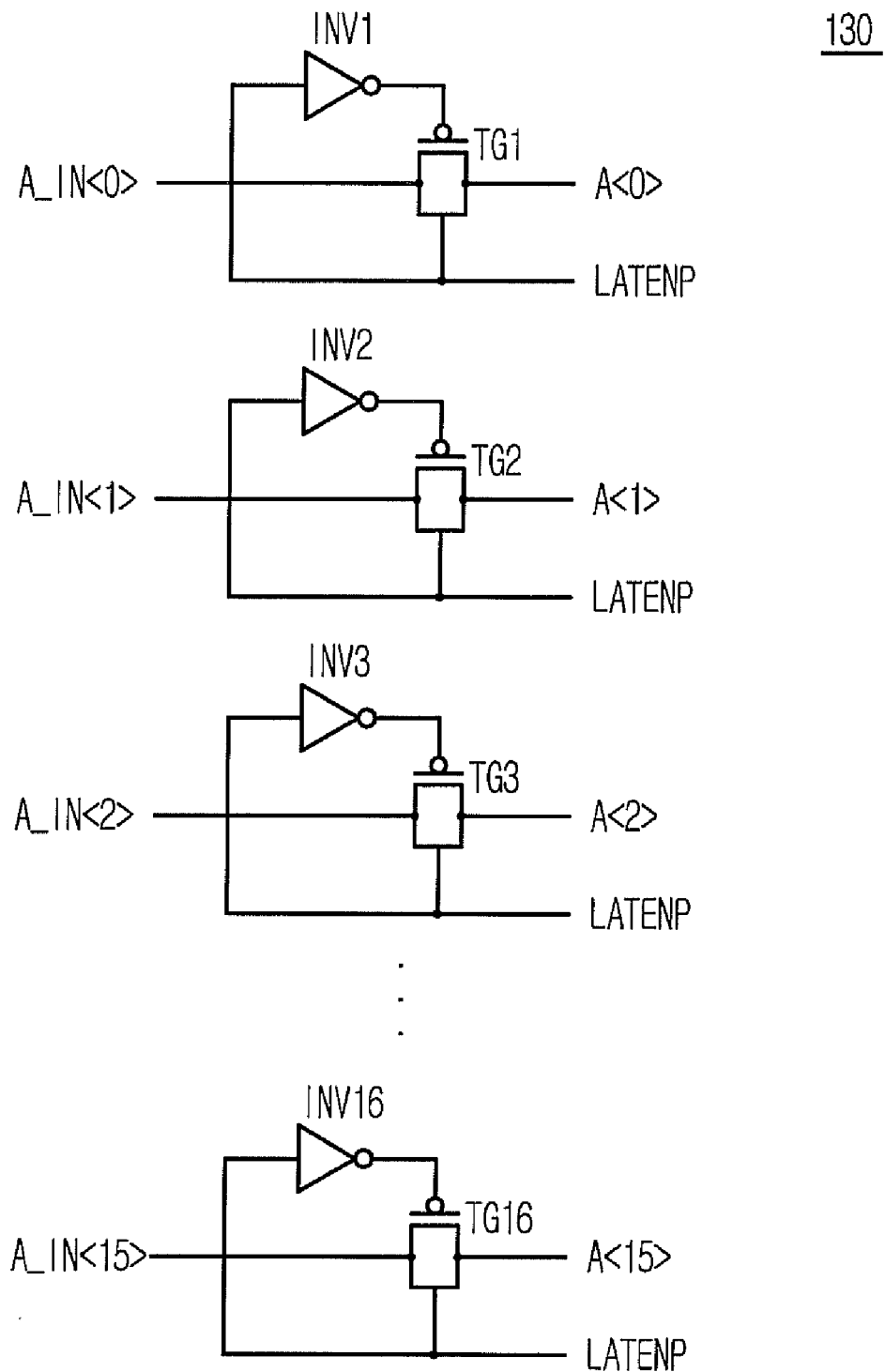
FIG. 6 is a circuit diagram of an aligner illustrated in FIG. 3.

FIG. 6 is a circuit diagram of the aligner 130 illustrated in FIG. 3.

The aligner 130 aligns the internal address signals A_IN<0:7> and A_IN<8:15> transferred 8 bits by 8 bits from the first and second shift registers 110 and 120 after a predetermined time $\Delta t1+\Delta t3$ from the rising edge of the second clock CLK1 of the internal clock ICLK, and generates 16-bit final address signals A<0:15>.

For this operation, as illustrated in FIG. 6, the ALIGNER 130 includes inverters INV1 to INV16 and a plurality of transfer gates TG1 to TG16.

Referring to FIG. 6, the aligner 130 aligns the internal address signals A_IN<0:7> and A_IN<8:15> input from the first and second shift registers 110 and 120 8 bits by 8 bits in response to a synchronization signal LATENP activated to a logic high level after the predetermined time $\Delta t1+\Delta t3$ from the rising edge of the second clock CLK1 of the internal clock ICLK, and outputs 16-bit final address signals A<0:15>.

The signal aligning circuit in accordance with the first embodiment of the present invention further includes an initialization signal generator for initializing the first and second shift registers 110 and 120 to a logic low level.

Figure 7:
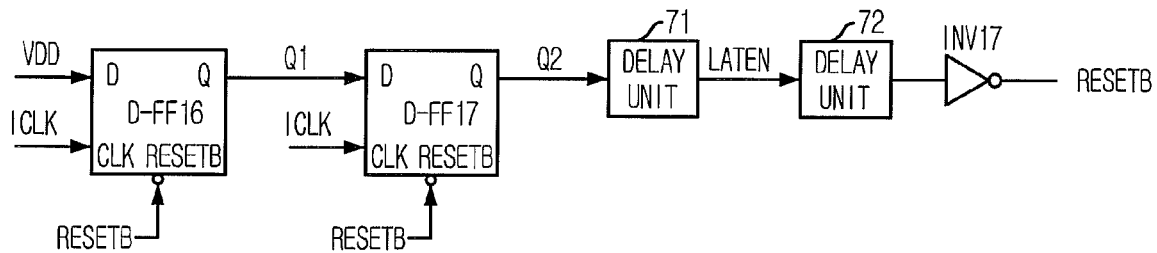
FIG. 7 is a circuit diagram of an initialization signal generator for generating an initialization signal illustrated in FIG. 3.

FIG. 7 is a circuit diagram of the initialization signal generator 140 for generating the initialization signal RESETB illustrated in FIG. 3.

The initialization signal generator 140 includes first and second D flip-flops D-FF16 and D-FF17, first and second delay units 71 and 72, and an inverter INV17.

The first D flip-flop D-FF16 receives a power supply voltage VDD input through an input terminal D and outputs the received signal as a first output signal Q1 to the second D flip-flop D-FF17 in synchronization with the rising edge of the first clock CLK0 of the internal clock ICLK. The second D flip-flop D-FF17 receives the first output signal Q1 and outputs the received signal as a second output signal Q2 to the first delay unit 71 in synchronization with the rising edge of the second clock CLK1 of the internal clock ICLK.

The first delay unit 71 generates a delay signal LATEN by delaying the second output signal Q2 by $A\Delta t1$ from the rising edge of the second clock CLK1 of the internal clock ICLK. The second delay unit 72 delays the delay signal LATEN by $\Delta t2$.

The delay value $\Delta t1+\Delta t2$ delayed by the first and second delay units 71 and 72 has to be greater than the time that is necessary for the aligner 130 to align the internal address signals A_IN<0:7> and A_IN<8:15> input 8 bits by 8 bits and then generate 16-bit address signals A<0:15>. That is, the delay value $\Delta t1+\Delta t2$ has to be greater than the time that is necessary for the aligner 130 to generate the 16-bit address signals A<0:15> from the rising edge of the second clock CLK1 of the internal clock ICLK. The reason for this is that the aligner 130 may not be initialized while generating the 16-bit address signals A<0:15> and the first and second shift registers 110 and 120 must maintain the internal address signals A_IN<0:7> and A_IN<8:15>.

The inverter INV17 outputs the initialization signal RESETB by inverting the phase of the output signal of the second DELAY UNIT 72.

Meanwhile, the signal aligning circuit further includes a synchronization signal generator for generating the synchronization signal LATENP to synchronize the aligner 130.

Figure 8:
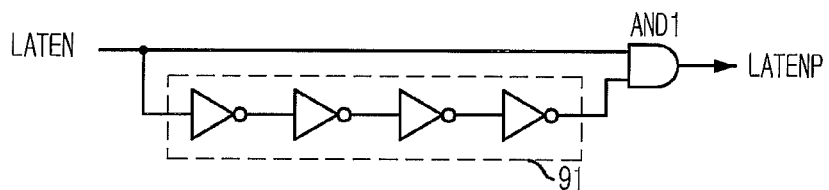
FIG. 8 is a circuit diagram of a synchronization signal generator for generating a synchronization signal illustrated in FIG. 3.

FIG. 8 is a circuit diagram of a synchronization signal generator 150 for generating the synchronization signal LATENP illustrated in FIG. 3.

The synchronization signal generator 150 includes a third delay unit 91 and an AND gate AND1.

The third delay unit 91 includes an inverter chain with a plurality of inverters connected in a chain form. It delays the delay signal LATEN by $\Delta t3$. At this point, the delay value $\Delta t3$ of the third delay unit 91 has to be less than the delay value $\Delta t2$ of the second delay unit 72. The reason for this is that the aligner 130 may not be initialized while generating the 16-bit address signals A<0:15> and the first and second shift registers 110 and 120 must maintain the internal address signals A_IN<0:7> and A_IN<8:15>. Consequently, the delay value $\Delta t1+\Delta t2$ is a time that is taken until the aligner 130 generates all of the 16-bit address signals A<0:15> from the rising edge of the second clock CLK1 of the internal clock ICLK.

Figure 9:
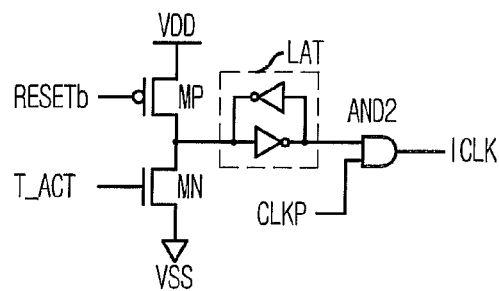
FIG. 9 is a circuit diagram of an internal clock generator for generating an internal clock illustrated in FIG. 3.

FIG. 9 is a circuit diagram of an internal clock generator 160 for generating the internal clock ICLK illustrated in FIG. 3.

The internal clock generator 160 includes a pull-up transistor MP, a pull-down transistor MN, a latch LAT, and an AND gate AND2.

The pull-up transistor MP is configured with a PMOS transistor. The pull-up transistor MP is turned on in response to the initialization signal RESETB and transfers the power supply voltage VDD to an input terminal of the latch LAT. The pull-down transistor MN is configured with an NMOS transistor. The pull-down transistor MN is turned on in response to an activation signal T_ACT, e.g., a signal used as a test activation signal to enter a test mode, and sets the input terminal of the latch LAT to a ground voltage VSS.

The latch LAT latches the power supply voltage VDD or the ground voltage VSS according to the operation states of the pull-up transistor MP and the pull-down transistor MN. For example, if the pull-up transistor MP is turned on and the pull-down transistor MN is turned off, the latch LAT latches the power supply voltage VDD. On the contrary, if the pull-up transistor MP is turned off and the pull-down transistor MN is turned on, the latch LAT latches the ground voltage VSS. In order for the first and second shift registers 110 and 120 to transfer the external address signals A_EXT<0:7>, the ground voltage VSS has to be input to the input terminal of the latch LAT. Accordingly, the latch LAT outputs a logic high level.

The AND gate AND2 generates the internal clock ICLK by performing an AND operation of the output of the latch LAT and a synchronization clock CLKP. The synchronization signal CLKP is synchronized with a rising edge of an external clock and has a waveform with a predetermined width from the rising edge of the external clock. For example, when the output of the latch LAT is in logic high state, the internal clock ICLK has the same period and phase as those of the synchronization clock CLKP.

Figure 10:
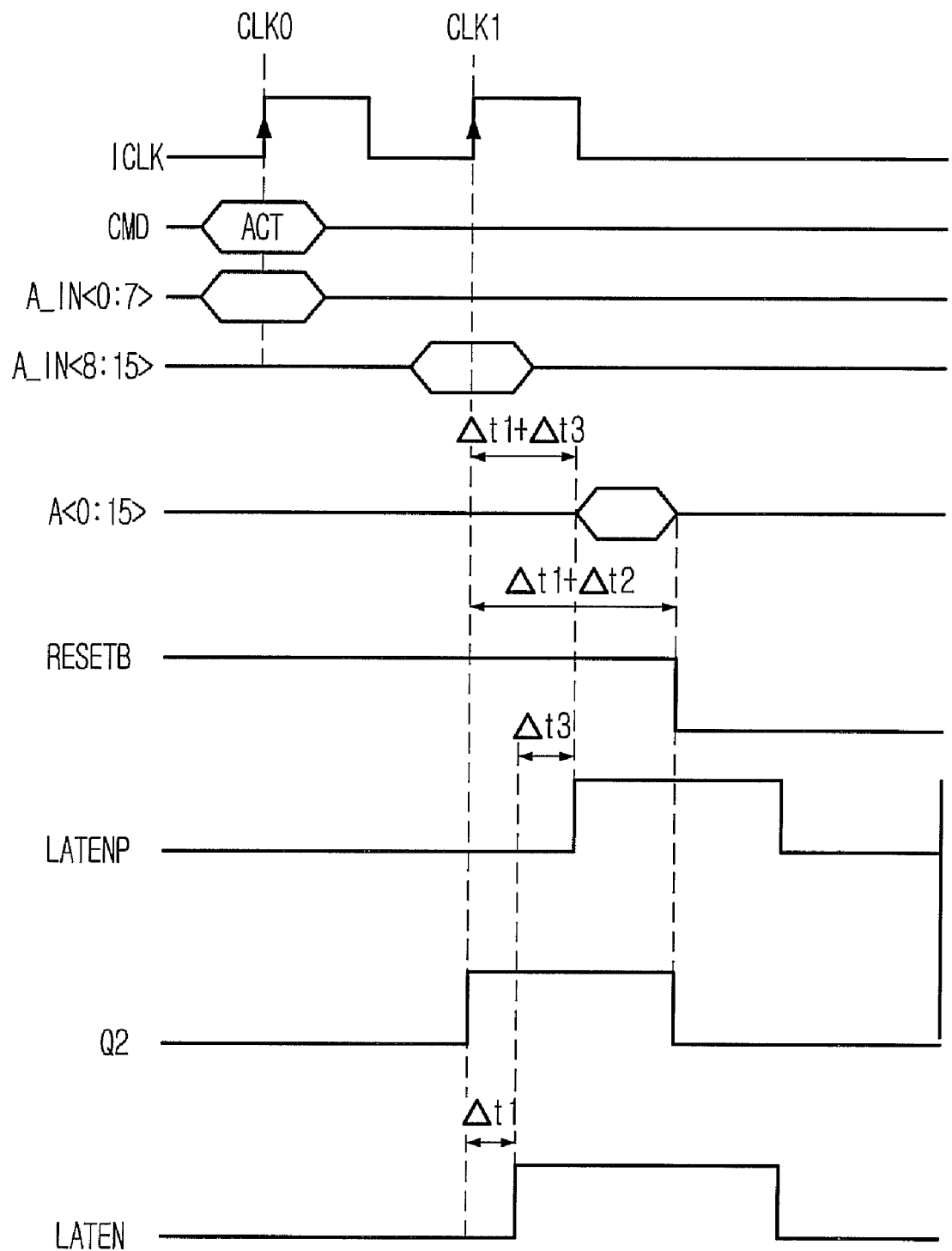
FIG. 10 is a waveform diagram for explaining an operation characteristic of the signal aligning circuit of FIG. 3.

FIG. 10 is a waveform diagram for explaining an operation characteristic of the signal aligning circuit of FIG. 3.

Hereinafter, referring to FIGS. 3 to 10, the operation characteristics of the signal aligning circuit in accordance with the first embodiment of the present invention will be described below.

Referring to FIGS. 3 to 10, the first shift register 110 transfers 8-bit external address signals A_EXT<0:7> to the second shift register 120 in synchronization with the rising edge of the first clock CLK0 of the internal clock ICLK. The 8-bit external signals A_EXT<0:7> are input from the eight pads P0 to P7 in parallel 1 bit by 1 bit. That is, at an initial operation, the 8-bit external address signals A_EXT<0:7> are stored.

Then, the second shift register 120 transfers the 8-bit internal address signals A_IN<0:7> to the aligner 130 in synchronization with the rising edge of the second clock CLK1 of the internal clock ICLK. The 8-bit internal address signals A_IN<0:7> are input from the first shift register 110.

At this point, the first shift register 110 receives 8-bit or other external address signals A_EXT<0:7> input through the eight pads P0 to P7 in parallel 1 bit by 1 bit, and outputs the 8-bit internal address signals A_IN<8:15>. That is, the first shift register 110 receives new external address signals and updates them as new internal address signals in synchronization with the rising edge of the second clock CLK1 of the internal clock ICLK. The second shift register 120 stores the internal address signals transferred from the first shift register 110.

Meanwhile, the first D flip-flop D-FF16 of the initialization signal generator 140 illustrated in FIG. 7 receives the power supply voltage VDD to output the first output signal Q1 of a logic high state in synchronization with the rising edge of the first clock CLK0 of the internal clock ICLK. The second D flip-flop D-FF17 of the initialization signal generator 140 receives the first output signal Q1 to output the second output signal Q2 of a logic high state in synchronization with the rising edge of the second clock CLK1 of the internal clock ICLK. The first delay unit 71 outputs the delay signal LATEN by delaying the second output signal Q2 by $A\Delta t1$. The second delay unit 72 delays the delay signal LATEN by $\Delta t2$. The delay signal LATEN that is further delayed by $\Delta t2$ by the second delay unit 72 is output as the initialization signal RESETB whose phase is inverted by the inverter INV17.

The internal address signals A_IN<0:7> and A_IN<8:15> output from the first and second shift registers 120 and 130 in synchronization with the rising edge of the second clock CLK1 of the internal clock ICLK are transferred to the aligner 130. The aligner 130 is operated in response to the synchronization signal LATENP that is produced by delaying the delay signal LATEN by $\Delta t3$ through the third delay unit 91. Consequently, the aligner 130 is operated after $\Delta t1+\Delta t3$ from the rising edge of the second clock CLK1 of the internal clock ICLK, and aligns the internal address signals A_IN<0:7> and A_IN<8:15> to output 16-bit address signals A<0:15>.

Meanwhile, the initialization signal RESETB is delayed by $\Delta t1+\Delta t2$ from the rising edge of the second clock CLK1 of the internal clock ICLK and then changed into a logic low state by the inverter INV17. Then, the initialization signal RESETB is input to a reset terminals of all of the D flip-flops included in the first and second shift registers 110 and 120 and the initialization signal generator 140, so that each D flip-flop is initialized to a logic low state. At this point, since $\Delta t2$ is greater than $\Delta t3$, it is possible to secure the time necessary to output the internal address signals A_IN<0:7> and A_IN<8:15> as 16-bit address signals A<0:15> before the D flip-flops of the first and second shift registers 110 and 120 and the initialization signal generator 140 are initialized.

An address aligning method of the multi-port memory device using the signal aligning circuit in accordance with the first embodiment of the present invention will be described below.

Figure 11:
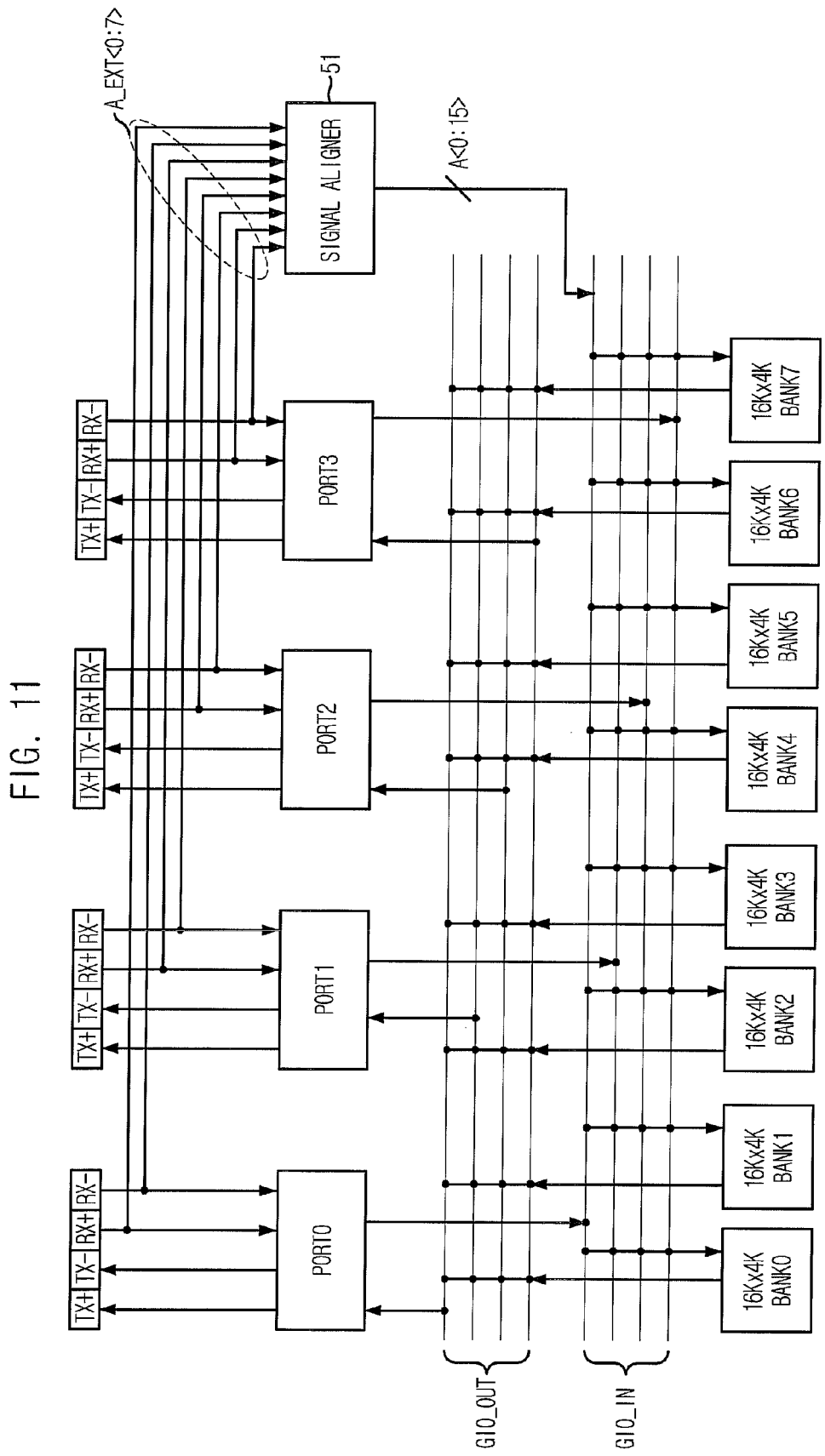
FIG. 11 is block diagram of a multi-port memory device in accordance with a second embodiment of the present invention.

FIG. 11 is a block diagram of a multi-port memory device in accordance with a second embodiment of the present invention. For convenience of explanation, the multi-port memory device having four ports PORT0-PORT3 and eight banks BANK0-BANK7 is illustrated. Each of the banks has a 16K (row)×4K (column) memory cell array. Also, the multi-port memory device has eight reception pads RX+ and RX−.

Since the multi-port memory device of FIG. 11 requires 6-bit column addresses so as to access the banks BANK0 to BANK7, the column addresses can be input through the eight reception pads RX+ and RX−. However, since the multi-port memory device requires 14-bit row addresses, it is impossible to receive all the row addresses through the eight reception pads RX+ and RX−. Also, 3-bit bank addresses are required to access the eight banks BANK0 to BANK7. Consequently, 17 bits including the row addresses and the bank addresses are required.

Therefore, the multi-port memory device in accordance with the second embodiment of the present invention receives 16-bit address signals through the eight reception pads RX+ and RX− during two clocks by using the signal aligner 51, and receives the remaining 1 bit through a separate dummy pad (not shown). For convenience, 1 bit input to the dummy pad will be omitted.

First, the ports PORT0 to PORT3 are designed such that they are deactivated by the activation signal T_ACT activated to a logic high state in a test mode and thus does not receive the external address signals A_EXT<0:7> input through the reception pads RX+ and RX−. Instead, the external address signals A_EXT<0:7> are bypassed to the SIGNAL ALIGNER 51. An external test device supplies 16-bit external address signals through the reception pads RX+ and RX− during two clocks 8 bits by 8 bits.

The signal aligner 51 has the same configuration as the signal aligning circuit described in the first embodiment of the present invention. The signal aligner 51 receives the external address signals A_EXT<0:7> input 8 bits by 8 bits through the reception pads RX+ and RX− at every rising edge of the internal clock during two clocks, aligns the 16-bit external address signals, and transfer the 16-bit final address signals A<0:15> through the global data buses GIO_IN.

Although the multi-port memory device has been described in the second embodiment of the present invention, the present invention can also be applied to semiconductor memory devices such as DRAM. That is, the present invention can be applied to all semiconductor memory devices in which the number of the reception pads is smaller than the number of bits of the address signals.

In accordance with the present invention, the semiconductor memory device can be stably tested without adding I/O pads even when the number of data I/O pads is smaller than the number of addresses for accessing the memory cell.

Also, in testing the DRAM core of the multi-port memory device using the test device supporting the parallel I/O interface, the test can be stably performed without adding I/O pads even when the number of data I/O pads is smaller than the number of addresses for accessing the memory cell.

The present application contains subject matter related to Korean patent application Nos. 2005-90855 and 2006-33765, filed in the Korean Intellectual Property Office on Sep. 28, 2005 and Apr. 13, 2006, respectively, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device having a memory cell array and performing a test operation by using first signals input through a plurality of pads in parallel 1 bit by 1 bit in a test mode, the semiconductor memory device comprising:
a signal aligning circuit for sequentially storing and aligning bits of the first signals the number of which corresponds to the number of pads, generating second signals the number of which is n times the number of the pads (where n is an integer equal to or greater than 2), and outputting the second signals to the memory cell array, wherein the first signals are address signals of the memory cell array.

2. The semiconductor memory device as recited in claim 1, wherein the signal aligning circuit includes:
first and second storage units for receiving the first signals and sequentially storing bits, the number of which corresponds to the number of the pads; and
an aligning unit for aligning the first signals transferred from the first and second storage units and generating the second signals.

3. The semiconductor memory device as recited in claim 2, wherein the first and second storage units store the first signals in synchronization with an internal clock.

4. The semiconductor memory device as recited in claim 2, wherein the first storage unit stores the first signals in synchronization with a first clock signal of the internal clock.

5. The semiconductor memory device as recited in claim 4, wherein the first storage unit stores the first signals in synchronization with a rising edge of the first clock signal of the internal clock.

6. The semiconductor memory device as recited in claim 4, wherein the second storage unit stores the first signals transferred from the first storage unit in synchronization with a second clock signal of the internal clock.

7. The semiconductor memory device as recited in claim 6, wherein the second storage unit stores the first signals transferred from the first storage unit in synchronization with a rising edge of the second clock signal of the internal clock.

8. The semiconductor memory device as recited in claim 6, wherein the first and second storage units include shift registers.

9. The semiconductor memory device as recited in claim 8, wherein the shift registers each include a plurality of D flip-flops the number of which corresponds to the number of the pads.

10. The semiconductor memory device as recited in claim 9, wherein the D flip-flop transfers the first signals 1 bit by 1 bit in synchronization with the internal clock.

11. The semiconductor memory device as recited in claim 8, wherein the aligning unit receives the first signals transferred from the first and second storage units, and outputs the second signals by delaying the received signals by a first delay value from the rising edge of the second clock of the internal clock.

12. The semiconductor memory device as recited in claim 11, wherein the aligning unit includes a plurality of transfer gates.

13. The semiconductor memory device as recited in claim 11, further comprising an initialization signal generator for initializing the shift registers after delaying as much as a second delay value greater than the first delay value from the rising edge of the second clock signal of the internal clock.

14. The semiconductor memory device as recited in claim 13, wherein the initialization signal generator includes:
a first D flip-flop for transferring a power supply voltage in synchronization with the rising edge of the first clock signal of the internal clock;
a second D flip-flop for transferring an output of the first D flip-flop in synchronization with the rising edge of the second clock signal of the internal clock;
a first delay unit for delaying an output of the second D flip-flop by a third delay value less than the first delay value;
a second delay unit for delaying an output of the first delay unit by a fourth delay value having a delay time given by subtracting the third delay value from the second delay value; and
an inverter for inverting a phase of the output of the second delay unit to output an initialization signal for initializing the shift registers.

15. The semiconductor memory device as recited in claim 14, wherein the first and second D flip-flops are initialized by the initialization signal.

16. The semiconductor memory device as recited in claim 14, further comprising a synchronization signal generator for generating a synchronization signal for controlling a synchronization of the aligning unit in response to the output of the first delay unit.

17. The semiconductor memory device as recited in claim 16, wherein the synchronization signal generator includes:
a third delay unit for delaying the output of the first delay unit by a fifth delay value having a delay time obtained by subtracting the third delay value from the first delay value; and
a logic gate for performing an AND operation of an output of the third delay unit and the output of the first delay unit.

18. A semiconductor memory device having a plurality of transmission/reception pads, a plurality of ports performing serial data communication with an external device through the transmission/reception pads, a plurality of banks performing a parallel data communication with the ports, and a plurality of global data buses providing data communication between the banks and the ports, the semiconductor memory device comprising:
a signal aligning circuit for sequentially storing and aligning bits of first signals from the reception pads 1 bit by 1 bit in a test mode of the bank, the bit number of which corresponding to the number of pads, generating second signals the bit number of which is n times the number of the reception pads (where n is an integer equal to or greater than 2), and outputting the second signals to the banks through the global data buses,
wherein the first signals are address signals of the memory cell array.

19. The semiconductor memory device as recited in claim 18, wherein the signal aligning circuit includes:
first and second storage units for receiving the first signals and sequentially storing bits, the number of which corresponds to the number of the pads; and
an aligning unit for aligning the first signals transferred from the first and second storage units and generating the second signals.

20. The semiconductor memory device as recited in claim 19, wherein the first and second storage units store the first signals in synchronization with an internal clock.

21. The semiconductor memory device as recited in claim 19, wherein the first storage unit stores the first signals in synchronization with a first clock signal of the internal clock.

22. The semiconductor memory device as recited in claim 21, wherein the first storage unit stores the first signals in synchronization with a rising edge of the first clock signal of the internal clock.

23. The semiconductor memory device as recited in claim 21, wherein the second storage unit stores the first signals transferred from the first storage unit in synchronization with a second clock signal of the internal clock.

24. The semiconductor memory device as recited in claim 23, wherein the second storage unit stores the first signals transferred from the first storage unit in synchronization with a rising edge of the second clock signal of the internal clock.

25. The semiconductor memory device as recited in claim 23, wherein the first and second storage units include shift registers.

26. The semiconductor memory device as recited in claim 25, wherein the shift register includes D flip-flops the number of which corresponds to the number of the pads.

27. The semiconductor memory device as recited in claim 26, wherein the D flip-flop transfers the first signals 1 bit by 1 bit in synchronization with the internal clock.

28. The semiconductor memory device as recited in claim 25, wherein the aligning unit receives the first signals transferred from the first and second storage units, and outputs the second signals by delaying the received signal by a first delay value from the rising edge of the second clock of the internal clock.

29. The semiconductor memory device as recited in claim 28, wherein the aligning unit includes a plurality of transfer gates.

30. The semiconductor memory device as recited in claim 28, further comprising an initialization signal generator for initializing the shift registers after delaying as much as a second delay value greater than the first delay value from the rising edge of the second clock of the internal clock.

31. The semiconductor memory device as recited in claim 30, wherein the initialization signal generator includes:
 a first D flip-flop for transferring a power supply voltage in synchronization with the rising edge of the first clock signal of the internal clock;
 a second D flip-flop for transferring an output of the first D flip-flop in synchronization with the rising edge of the second clock signal of the internal clock;
 a first delay unit for delaying an output of the second D flip-flop by a third delay value less than the first delay value;
 a second delay unit for delaying an output of the first delay unit by a fourth delay value having a delay time obtained by subtracting the third delay value from the second delay value; and
 an inverter for inverting a phase of the output of the second delay unit to output an initialization signal for initializing the shift registers.

32. The semiconductor memory device as recited in claim 31, wherein the first and second D flip-flops are initialized by the initialization signal.

33. The semiconductor memory device as recited in claim 31, further comprising a synchronization signal generator for generating a synchronization signal for controlling a synchronization of the aligning unit in response to the output of the first delay unit.

34. The semiconductor memory device as recited in claim 33, wherein the synchronization signal generator includes:
 a third delay unit for delaying the output of the first delay unit by a fifth delay value having a delay time given by subtracting the third delay value from the first delay value; and
 a logic gate for performing an AND operation of an output of the third delay unit and the output of the first delay unit.

35. A semiconductor memory device having a memory cell array and performing a test operation by using external address signals input through a plurality of pads during a test mode, the semiconductor memory device comprising:
 a signal aligning circuit for sequentially receiving and storing bits of the external address signals the number of which corresponds to the number of pads, generating and aligning internal address signals the number of which is n times the number of the pads (where n is an integer equal to or greater than 2), and outputting aligned internal address signals to the memory cell array.

36. The semiconductor memory device as recited in claim 35, wherein the signal aligning circuit includes:
 first and second storage units for receiving and sequentially storing the external address signals, and outputting the internal address signals; and
 an aligning unit for aligning the internal address signals transferred from the first and second storage units and generating the aligned internal address signals.

37. The semiconductor memory device as recited in claim 36, wherein the first and second storage units store the external address signals and internal address signals in synchronization with an internal clock, respectively.

38. The semiconductor memory device as recited in claim 36, wherein the first storage unit stores the external address signals in synchronization with a first clock signal of the internal clock.

39. The semiconductor memory device as recited in claim 38, wherein the first storage unit stores the external address signals in synchronization with a rising edge of the first clock signal of the internal clock.

40. The semiconductor memory device as recited in claim 38, wherein the second storage unit stores the internal address signals transferred from the first storage unit in synchronization with a second clock signal of the internal clock.

41. The semiconductor memory device as recited in claim 40, wherein the second storage unit stores the internal address signals transferred from the first storage unit in synchronization with a rising edge of the second clock signal of the internal clock.

42. The semiconductor memory device as recited in claim 40, wherein the first and second storage units include shift registers.

43. The semiconductor memory device as recited in claim 42, wherein the shift registers each include a plurality of D flip-flops the number of which corresponds to the number of the pads.

44. The semiconductor memory device as recited in claim 42, wherein the aligning unit receives the internal address signals transferred from the first and second storage units, and aligns and outputs the internal address signals by delaying the received signals by a first delay value from the rising edge of the second clock signal of the internal clock.

45. The semiconductor memory device as recited in claim 44, wherein the aligning unit includes a plurality of transfer gates.

46. The semiconductor memory device as recited in claim 44, further comprising an initialization signal generator for initializing the shift registers after delaying for a second delay value greater than the first delay value from the rising edge of the second clock signal of the internal clock.

* * * * *